US007084227B2

(12) United States Patent
Jung et al.

(10) Patent No.: US 7,084,227 B2
(45) Date of Patent: *Aug. 1, 2006

(54) PHOTOSENSITIVE POLYMER AND CHEMICALLY AMPLIFIED PHOTORESIST COMPOSITION CONTAINING THE SAME

(75) Inventors: Dong-won Jung, Yongin (KR); Sang-jun Choi, Seoul (KR); Si-hyeung Lee, Suwon (KR); Sook Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

This patent is subject to a terminal disclaimer.

(21) Appl. No.: 10/925,983

(22) Filed: Aug. 26, 2004

(65) Prior Publication Data

US 2005/0019693 A1  Jan. 27, 2005

Related U.S. Application Data

(62) Division of application No. 10/383,770, filed on Mar. 10, 2003, now Pat. No. 6,893,793, which is a division of application No. 10/218,637, filed on Aug. 15, 2002, now Pat. No. 6,593,441, which is a division of application No. 09/628,499, filed on Jul. 28, 2000, now Pat. No. 6,472,120.

(30) Foreign Application Priority Data

Jul. 29, 1999 (KR) .................................. 99-31060

(51) Int. Cl.
*C08F 10/00* (2006.01)
(52) U.S. Cl. .................. 526/281.1; 526/271; 526/326; 430/270.1
(58) Field of Classification Search ................ 526/281, 526/319
See application file for complete search history.

(56) References Cited

U.S. PATENT DOCUMENTS

| 3,715,330 | A | 2/1973 | Nogami et al. |
| 6,103,450 | A | 8/2000 | Choi |
| 6,258,508 | B1 | 7/2001 | Kim et al. |
| 6,312,868 | B1 | 11/2001 | Kong et al. |
| 6,316,162 | B1 | 11/2001 | Jung et al. |
| 2002/0091216 | A1 | 7/2002 | Lee et al. |

FOREIGN PATENT DOCUMENTS

| GB | 2336845 | 3/1999 |
| GB | 2332679 | 6/1999 |
| JP | 10-130340 | 5/1998 |
| JP | 10-153864 | 6/1998 |
| JP | 10-218947 | 8/1998 |
| JP | 10-316720 | 12/1998 |
| JP | 11-2903 | 1/1999 |
| JP | 11-160877 | 6/1999 |
| JP | 11-255840 | 9/1999 |
| JP | 11-2558802 | 9/1999 |
| JP | 11-279122 | 10/1999 |
| JP | 11-286469 | 10/1999 |
| JP | 2000-86725 | 3/2000 |
| JP | 2000-86726 | 3/2000 |
| JP | 2000-206683 | 7/2000 |
| JP | 2000-235263 | 8/2000 |
| JP | 2000-292917 | 10/2000 |

*Primary Examiner*—Rosemary Ashton
(74) *Attorney, Agent, or Firm*—Volentine Francos & Whitt, PLLC

(57) ABSTRACT

The photosensitive polymer includes a first monomer which is norbornene ester having $C_1$ to $C_{12}$ aliphatic alcohol as a substituent, and a second monomer which is maleic anhydride. A chemically amplified photoresist composition, containing the photosensitive polymer, has an improved etching resistance and adhesion to underlying layer materials, and exhibits wettability to developing solutions.

4 Claims, No Drawings

PHOTOSENSITIVE POLYMER AND CHEMICALLY AMPLIFIED PHOTORESIST COMPOSITION CONTAINING THE SAME

CROSS-REFERENCE TO RELATED APPLICATIONS

This application is a divisional application of Ser. No. 10/383,770, filed Mar. 10, 2003, now U.S. Pat. No. 6,893,793; which was a divisional of Ser. No. 10/218,637, filed Aug. 15, 2002, now U.S. Pat. No. 6,593,441; which was a divisional of Ser. No. 09/628,499, filed Jul. 28, 2000, now U.S. Pat. No. 6,472,120.

BACKGROUND OF THE INVENTION

1. Field of the Invention

The present invention relates to a photosensitive polymer and to a chemically amplified photoresist composition containing the same.

This application is a counterpart of, and claims priority to, Korean Application No. 99-31060, filed Jul. 29, 1999, the contents of which are incorporated herein by reference.

2. Description of the Related Art

As semiconductor devices become highly integrated, photolithography processes used in the fabrication of such devices must be capable of forming ultra-fine patterns. For example, a sub-quarter micron or smaller sized pattern is needed in a semiconductor memory device having a capacity exceeding 1 Gbit. As such, a photolithography technology has been proposed which employs an argon fluoride (ArF) excimer laser as a new type of light source. This is because the ArF laser exhibits a wavelength (193 nm) which is shorter than the wavelength (248 nm) of a conventional krypton fluoride KrF excimer laser. Therefore, a demand has arisen for chemically amplified photoresist polymers and photoresist compositions which are suitable for use with the ArF excimer laser.

In general, a chemically amplified photoresist composition for an ArF excimer laser should exhibit the following characteristics. (1) transparency at a wavelength of 193 nm; (2) excellent thermal properties (for example, high glass transition temperature); (3) good adhesion to underlying (and overlying) film materials; (4) high resistance to dry etching; and (5) easily capable of being developed using developing solutions which are in widespread use in the manufacture of semiconductor devices, for example, 2.38% by weight of tetramethyl ammonium hydroxide (TMAH).

However, a terpolymer comprising methylmethacrylate, t-butyl methacrylate and methacrylic acid, which is a widely known chemically amplified photoresist polymer for the ArF excimer laser, doses not exhibit all of the above-mentioned characteristics. In particular, the terpolymer has a very low resistance to dry etching, a low adhesion to underlying film materials and low wettability for a developing solution.

Recently, attempts have been made to increase the etching resistance of a photosensitive polymer for the ArF excimer laser by introducing alicyclic compounds, for example, isobornyl, adamantyl or tricyclodecanyl group, into the backbone of the polymers. However, these polymers also have several disadvantages. For example, their etching resistance is still not acceptable and their adhesion characteristics to underlying films are still poor, which results in lifting of photoresist patterns.

SUMMARY OF THE INVENTION

It is an objective of the present invention to provide a photosensitive polymer which is capable of being exposed using an ArF excimer laser, and which has an improve etching resistance and an improved adhesion to an underlying film or substrate.

It is another objective of the present invention to provide a chemically amplified photoresist composition containing the photosensitive polymer.

Accordingly, to achieve the above objective, there is provided a photosensitive polymer including a first monomer which is norbornene ester having $C_1$ to $C_{12}$ aliphatic alcohol as a substituent, and a second monomer which is maleic anhydride.

Preferably, the $C_1$ to $C_{12}$ aliphatic alcohol is secondary alcohol.

The photosensitive polymer according to the present invention may further include at least one third monomer selected from the group consisting of norbornene carboxylic acid, norbornene ester having a $C_6$ to $C_{20}$ alicyclic ester having C as a substituent, norbornene ester having an acid-labile group as a substituent, (meth)acrylic acid, (meth)acrylate having $C_1$ to $C_{12}$ aliphatic alcohol as a substituent, (meth)acrylate having an acid-labile group as a substituent, and (meth)acrylate having a $C_6$ to $C_{20}$ alicyclic ester having C as a substituent.

In the case where the third monomer is norbornene ester having a $C_6$ to $C_{20}$ alicyclic ester having a C group or (meth)acrylate having a $C_6$ to $C_{20}$ alicyclic ester as a substituent, the first monomer may be norbornene having $C_1$ to $C_{12}$ aliphatic alcohol as a substituent, norbornene carboxylic acid, norbornene having $C_1$ to $C_{12}$ aliphatic ester having C group having carboxy group pendent thereto as a substituent, or norbornene having $C_1$ to $C_{12}$ aliphatic ester having a C group having a carboxylic anhydride group pendent thereto as a substituent.

According to another aspect of the present invention, there is provided a photosensitive polymer including, in addition to the first and second monomers, a third monomer selected from the group consisting of norbornene carboxylic acid, norbornene ester having $C_6$ to $C_{20}$ aliphatic ester having a C group as a substituent and norbornene ester having an acid-labile group as a substituent, and a fourth monomer selected from the group consisting of (meth)acrylic acid, (meth)acrylate having $C_1$ to $C_{12}$ aliphatic alcohol as a substituent, (meth)acrylate having an acid-labile group as a substituent and(meth)acrylate having an aliphatic ester having a C group as a substituent.

In the case where the third monomer is (meth)acrylate having $C_6$ to $C_{20}$ alicyclic ester having a C group as a substituent, the first monomer may be norbornene having $C_1$ to $C_{12}$ aliphatic alcohol as a substituent, norbornene carboxylic acid, norbornene having $C_1$ to $C_{12}$ aliphatic ester having a C group having carboxy group pendent thereto as a substituent, norbornene having $C_1$ to $C_{12}$ aliphatic ester having a C group having a carboxylic anhydride group pendent thereto as a substituent, and norbornene ester having $C_1$ to $C_{12}$ aliphatic alcohol having a carboxylic anhydride group pendent thereto as a substituent.

Also, the present invention provides photosensitive polymer including a first monomer selected from the group consisting of norbornene having $C_1$ to $C_{12}$ aliphatic alcohol as a substituent, norbornene carboxylic acid, norbornene having $C_1$ to $C_{12}$ aliphatic ester having a C group having carboxy group pendent thereto as a substituent, norbornene having $C_1$ to $C_{12}$ aliphatic ester having a C group having a carboxylic anhydride group pendent thereto as a substituent, and norbornene ester having $C_1$ to $C_{12}$ aliphatic alcohol having a carboxylic anhydride group pendent thereto as a substituent, a second monomer which is maleic anhydride, a third monomer which is norbornene ester having an acid-labile group as a substituent, and a fourth monomer which is norbornene ester having $C_6$ to $C_{20}$ alicyclic ester having a C group as a substituent.

To accomplish another object of the present invention, there is provided a chemically amplified photoresist composition including one or more photosensitive polymers each having an average-weight molecular weight of 3,000 to 100,000, and selected from the group consisting of first through sixth photosensitive polymers, and a photoacid generator contained in an amount of 1 to 15% by weight based on the total weight of the one or more photosensitive polymers.

The chemically amplified photoresist composition may further include 1 to 50% by weight of a dissolution inhibitor based on the total weight of the one or more photosensitive polymers. Also, the chemically amplified photoresist composition may further include 0.01 to 2.0% by weight of an organic base based on the total weight of the photosensitive polymer.

The photosensitive polymer according to the present invention has a cyclic backbone, and a hydroxy group is bonded to the backbone. Thus, the etching resistance of the photoresist composition containing the same is large and an adhesion to an underlying film is excellent. In particular, in the case where a secondary alcohol group is bonded to the backbone, the polymer is chemically stable so that it can be stored for a long period of time.

DESCRIPTION OF THE PREFERRED EMBODIMENTS

A photosensitive polymer and a chemically amplified photoresist composition containing the same according to the present invention will now be described. Also, a preferred photolithography process using the chemically amplified photoresist composition will be described. This invention may, however, be embodied in many different forms, and these embodiments are provided so that this disclosure will be thorough and complete, and will fully convey the scope of the invention to those skilled in the art.

Photosensitive Polymer

A photosensitive polymer according to a first embodiment of the present invention includes a first monomer which is norbornene ester having $C_1$ to $C_{12}$ aliphatic alcohol as a substituent and a second monomer which is maleic anhydride.

In order to increase the stability of the photosensitive polymer, the $C_1$ to $C_{12}$ aliphatic alcohol is preferably secondary alcohol.

The photosensitive polymer according to a first embodiment of the present invention is represented by the formula (1):

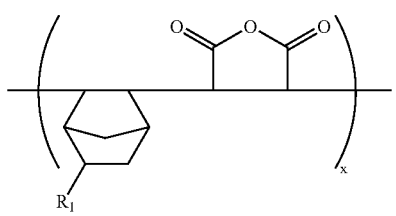

wherein $R_1$ is an oxycarbonyl having $C_1$ to $C_{12}$ aliphatic alcohol as a substituent and the weight average molecular weight of the polymer is in the range of 3,000 to 100,000.

Preferably, the $C_1$ to $C_{12}$ aliphatic alcohol is secondary alcohol. For example, 2° propanol can be used as the $C_1$ to $C_{12}$ aliphatic alcohol.

The photosensitive polymer has a cyclic backbone, and a hydroxy group is bonded to the backbone. Thus, the etching resistance of the photoresist composition containing the same is large and an adhesion to an underlying film is excellent. In particular, in the case where a secondary alcohol group is bonded to the backbone, the polymer is chemically stable so that it has excellent durability.

A photosensitive polymer according to a second embodiment of the present invention includes, in addition to the first monomer and the second monomer of the first embodiment, at least one third monomer selected from the group consisting of norbornene carboxylic acid, norbornene ester having a $C_6$ to $C_{20}$ alicyclic ester having C as a substituent, norbornene ester having an acid-labile group as a substituent, (meth)acrylic acid, (meth)acrylate having $C_6$ to $C_{20}$ aliphatic alcohol as a substituent, acid-labile group pendent to the (meth)acrylate, and (meth)acrylate having a $C_6$ to $C_{20}$ alicyclic hydrocarbon as a substituent.

Like in the first embodiment, the $C_1$ to $C_{12}$ aliphatic alcohol is preferably secondary alcohol.

The $C_6$ to $C_{20}$ alicyclic hydrocarbon group is preferably adamantyl, norbornyl, isobornyl or naphtyl, the acid-labile group pendent to the norbornene ester is preferably t-butyl, 1-alkoxy ethyl or tetrahydropyranyl, the (meth)acrylate having $C_1$ to $C_{12}$ aliphatic alcohol as a substituent is preferably 2-hydroxyethyl, and the acid-labile group pendent to the (meth)acrylate is preferably t-butyl or 2-methyladamantyl.

In particular, a suitable first monomer includes 2° propanol norbornene ester, and a suitable third monomer includes adamantyl(meth)acrylate, norbornyl(meth)acrylate, isobornyl(meth)acrylate, naphtyl(meth)acrylate, t-butyl (meth)acrylate or 2-methyladamantyl(meth)acrylate.

The photosensitive polymer according to a third embodiment of the present invention includes a first monomer selected from the group consisting of norbornene having aliphatic alcohol as a substituent, norbornene carboxylic acid, norbornene having a $C_1$ to $C_{12}$ aliphatic hydrocarbon group with a carboxy group pendent thereto as a substituent; and norbornene having a $C_1$ to $C_{12}$ aliphatic hydrocarbon group with a carboxylic anhydride group pendent thereto as a substituent; a second monomer which is maleic anhydride; and a third monomer selected from the group consisting of norbornene ester having a $C_6$ to $C_{20}$ alicyclic hydrocarbon group as a substituent and (meth)acrylate having a $C_6$ to $C_{20}$ alicyclic hydrocarbon group as a substituent, and the weight average molecular weight of the monomers is in the range of 3,000 to 100,000.

If the $C_6$ to $C_{20}$ alicyclic hydrocarbon group is bonded to the backbone of the polymer, the unexposed photosensitive polymer is not easily dissolved in a developing solution. Thus, in the case where a photoresist layer is made of such a photosensitive polymer, since the photoresist layer of the unexposed region is not easily dissolved in a developing solution, a loss in the thickness of a photoresist pattern ($T_{PR}$ loss), which is encountered in the conventional art, can be suppressed.

In particular, a suitable third monomer includes adamantyl(meth)acrylate, norbornyl(meth)acrylate, isobornyl(meth) acrylate and naphtyl(meth)acrylate.

The photosensitive polymer according to a fourth embodiment of the present invention includes a first monomer which is norbornene ester having $C_1$ to $C_{12}$ aliphatic alcohol as a substituent; a second monomer which is maleic anhydride; a third monomer selected from the group consisting of norbornene carboxylic acid, norbornene ester having a $C_6$ to $C_{20}$ alicyclic hydrocarbon group as a substituent and acid-labile group pendent to the norbornene ester; and, a fourth monomer selected from the group consisting of (meth) acrylic acid, (meth)acrylate having $C_1$ to $C_{12}$ aliphatic alcohol as a substituent, (meth)acrylate having an acid-labile group as a substituent, and (meth)acrylate having a $C_6$ to $C_{20}$ alicyclic hydrocarbon group as a substituent, and the weight average molecular weight of the polymer is in the range of 3,000 to 100,000.

Preferably; a suitable first monomer includes 2° propanol norbornene ester, a suitable third monomer includes t-butyl norbornene ester, and a suitable fourth monomer includes adamantyl(meth)acrylate, norbornyl(meth)acrylate, isobornyl(meth)acrylate, naphtyl(meth)acrylate, t-butyl (meth)acrylate or 2-methyladamantyl(meth)acrylate.

The photosensitive polymer according to a fifth embodiment of the present invention includes a first monomer selected from the group consisting of norbornene having $C_1$ to $C_{12}$ aliphatic alcohol as a substituent, norbornene carboxylic acid, norbornene having a $C_1$ to $C_{12}$ aliphatic hydrocarbon group with a carboxyl group pendent thereto as a substituent, and norbornene having a $C_1$ to $C_{12}$ aliphatic hydrocarbon group with a carboxylic anhydride pendent thereto as a substituent; a second monomer which is maleic anhydride; a third monomer selected from the group consisting of norbornene carboxylic acid, norbornene ester having a $C_6$ to $C_{20}$ alicyclic hydrocarbon group as a substituent, and norbornene ester having an acid-labile group as a substituent; and a fourth monomer which is (meth)acrylate having a $C_6$ to $C_{20}$ alicyclic hydrocarbon group as a substituent, and the weight average molecular weight of the polymer is in the range of 3,000 to 100,000.

Preferably, a suitable first monomer includes norbornene methanol, and a suitable third monomer includes t-butyl norbornene ester, suitable fourth monomer includes adamantyl(meth)acrylate, norbornyl(meth)acrylate, isobornyl (meth)acrylate or naphtyl(meth)acrylate.

The photosensitive polymer according to a sixth embodiment of the present invention includes a first monomer which is norbornene having $C_1$ to $C_{12}$ aliphatic alcohol as a substituent, norbornene carboxylic acid, norbornene having a $C_1$ to $C_{12}$ aliphatic hydrocarbon group with a carboxylic group pendent thereto as a substituent, norbornene having a $C_1$ to $C_{12}$ aliphatic hydrocarbon group with a carboxylic anhydride group pendent thereto as a substituent, or norbornene ester having $C_1$ to $C_{12}$ aliphatic alcohol as a substituent; a second monomer which is maleic anhydride; a third monomer which is norbornene ester having an acid-labile group as a substituent; and a fourth monomer which is norbornene ester having a $C_6$ to $C_{20}$ alicyclic hydrocarbon group as a substituent, and the weight average molecular weight of the polymer is in the range of 3,000 to 100,000.

Preferably, a suitable first monomer includes 2° propanol norbornene ester, a suitable third monomer includes t-butyl norbornene ester, and a suitable fourth monomer includes adamantyl norbornene ester, norbornyl norbornene ester, isobornyl norbornene ester or naphtyl norbornene ester.

The photosensitive polymers according to the first through sixth embodiments of the present invention can be represented by the formula (2):

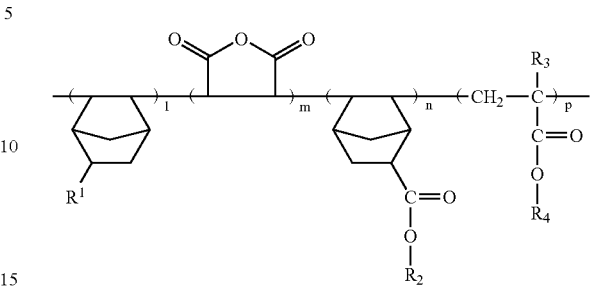

wherein $R_1$ is a carboxy group, a $C_1$ to $C_{12}$ aliphatic alcohol group, a $C_1$ to $C_{12}$ aliphatic hydrocarbon group having a carboxy group pendent thereto as a substituent, a $C_1$ to $C_{12}$ aliphatic hydrocarbon group having a carboxylic anhydride group pendent thereto as a substituent or a $C_1$ to $C_{12}$ aliphatic alcohol oxycarbonyl; $R_2$ is hydrogen, a $C_6$ to $C_{20}$ alicyclic hydrocarbon group or an acid-labile group; $R_3$ is hydrogen or methyl; $R_4$ is hydrogen, a $C_1$ to $C_{12}$ aliphatic alcohol, an acid-labile group or a $C_6$ to $C_{20}$ alicyclic hydrocarbon group; l, m, n, and p are integers, where $l/(l+m+n+p)$ equals 0.05 to 0.5, $m/(l+m+n+p)$ equals 0.3 to 0.5, $n/(l+m+n+p)$ equals 0.0 to 0.3, $p/(l+m+n+p)$ equals to 0.0 to 0.4; and the weight average molecular weight of the polymers is preferably in the range of 3,000 to 100,000.

As described in the first through sixth embodiments, $R_1$ is preferably a hydroxymethyl group or a $C_1$ to $C_{12}$ aliphatic alcohol oxycarbonyl group to improve adhesion to an underlying film. In particular, the $C_1$ to $C_{12}$ aliphatic alcohol is secondary alcohol, preferably 2° hydroxypropyloxycarbonyl, to improve the stability of the polymer.

Also, $R_2$ or $R_4$ is preferably a $C_6$ to $C_{20}$ alicyclic hydrocarbon group so that the photoresist layer of an unexposed region may not be easily dissolved in a developing solution.

Usable $C_6$ to $C_{20}$ alicyclic hydrocarbon groups include adamantyl, norbornyl, isobornyl or naphtyl.

Also, a monomer in which $R_2$ is an acid-labile group such as t-butyl and a monomer in which $R_2$ is a $C_6$ to $C_{20}$ alicyclic hydrocarbon group may be simultaneously used to further increase the etching resistance.

In order to increase a difference in the solubility of the photosensitive polymer for a developing solution before and after exposure, that is, contrast, at least one of $R_2$ and $R_4$ is preferably an acid-labile group. In $R_2$, examples of the acid-labile group include t-butyl, 1-alkoxyethyl or tetrahydropyranyl, and in $R_4$, examples of the acid-labile group include t-butyl or 2-methyladamantyl.

Since the backbone of the photosensitive polymer according to the present invention has a cyclic structure, the etching resistance thereof is large. In the case where a hydroxy group is bonded to the backbone, the polymer exhibits good adhesion to underlying layers and high wettability to a developing solution. Also, in the case where the alicyclic hydrocarbon group is bonded to the backbone, the etching resistance is further increased and the solubility of the photoresist layer of an unexposed region to the developing solution is reduced. Thus, it is possible to prevent the thickness of a photoresist pattern from decreasing.

Chemically Amplified Photoresist Composition

A chemically amplified photoresist composition of the present invention includes the above-described photosensitive polymer and a photoacid generator. The photoacid generator is preferably contained in an amount of 1 to 15% by weight based on the total weight of the photosensitive polymer. The photoacid generator is preferably a substance that has high thermal stability. Therefore, suitable photoacid generators include triarylsulfonium salts, diaryliodonium salts, sulfonates or N-hydroxysuccinimide triflates. Examples of triarylsulfonium salts include triphenylsulfonium triflate and triphenylsulfonium antimonate. Examples of diaryliodonium salts include diphenyliodonium triflate, diphenyliodonium antimonate, methoxydiphenyliodonium triflate and di-t-butyldiphenyliodonium triflate. Examples of sulfonates include 2,6-dinitro benzyl sulfonate and pyrogallol tris(alkyl-sulfonates).

Preferably, the photoresist composition of the present invention further includes 0.01 to 2.0% by weight of organic base based on the total weight of the photosensitive polymer. Suitable organic bases include triethylamine, triisobutylamine, triisooctylamine, diethanolamine or triethanolamine. The organic base is added for preventing a pattern from being deformed due to acidolysis of photoresist composition forming unexposed regions after exposure, which results from diffusion of the acid generated at the exposed regions into the unexposed regions.

Also, the photoresist composition according to the present invention preferably further includes 1 to 50% by weight of a dissolution inhibitor based on the weight of the photosensitive polymer. A material which has an acid-labile group is used as the dissolution inhibitor such that the dissolution inhibitor in the exposed region is easily dissolved in a developing solution.

In the case where the composition contains a dissolution inhibitor, an acid-labile group is not necessarily contained in the photosensitive polymer. In the case where the composition contains a photosensitive polymer having the acid-labile group pendent thereto and a dissolution inhibitor, a difference in the solubility between an exposed region and an unexposed region is noticeably increased, thereby improving the contrast. Examples of the dissolution inhibitor include t-butyl lithocholate.

Method for Preparing Photosensitive Polymer

Synthesis of Monomer

1. Synthesis of Norbornene Ester Having $C_1$ to $C_{12}$ Aliphatic Alcohol as a Substituent Cyclopentadiene (I) is dissolved in an organic solvent and then $C_1$ to $C_{12}$ aliphatic alcohol substituted acrylate (II) is added thereto to prepare norbornene ester (III) as expressed in the following reaction scheme (1):

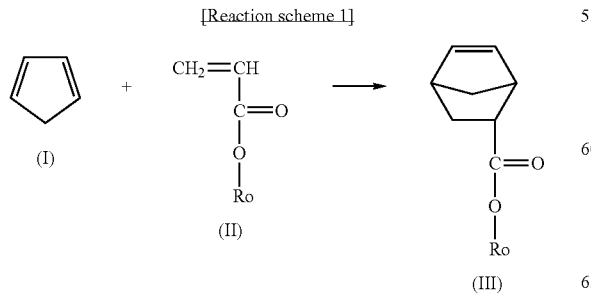

wherein $R_0$ is $C_1$ to $C_{12}$ aliphatic alcohol.

2. Synthesis of Norbornene Having $C_1$ to $C_{12}$ Aliphatic Alcohol as a Substituent 5-norbornene-2-aldehyde (V) is dissolved in aliphatic alcohol magnesium bromide (IV) solution to prepare norbornene having $C_1$ to $C_{12}$ aliphatic alcohol as a substituent (VI) by a substitution reaction, as expressed in the following reaction scheme (2):

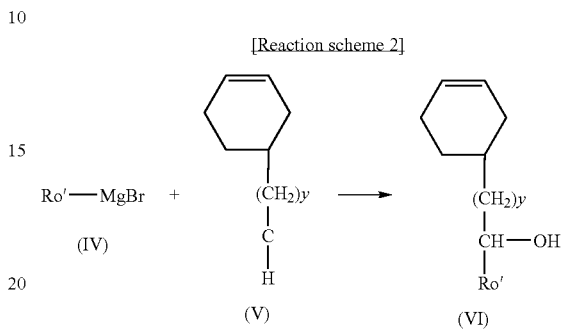

wherein $R_0'$ is an aliphatic hydrocarbon and y is an integer from 1 to 10.

3. Synthesis of Norbornene Ester Having $C_6$ to $C_{20}$ Alicyclic Hydrocarbon or an Acid-labile Group as a Substituent Cyclopentadiene is dissolved in an organic solvent and then acrylate having $C_6$ to $C_{20}$ alicyclic hydrocarbon as a substituent or acrylate having an acid-labile group as a substituent is added thereto to prepare norbornene ester.

Synthesis of Polymer

A first monomer (VII) synthesized in the first or second method, a second monomer (VIII), a third monomer (IX) synthesized by the third method, and a fourth monomer (X) are dissolved in an organic solvent, for example, toluene, in a mixture ratio of l:m:n:p, and then a polymerization initiator, for example, azobisisobutyronitrile (AIBN) is added to carry out polymerization, thereby preparing a polymer, as expressed in the following reaction scheme (3):

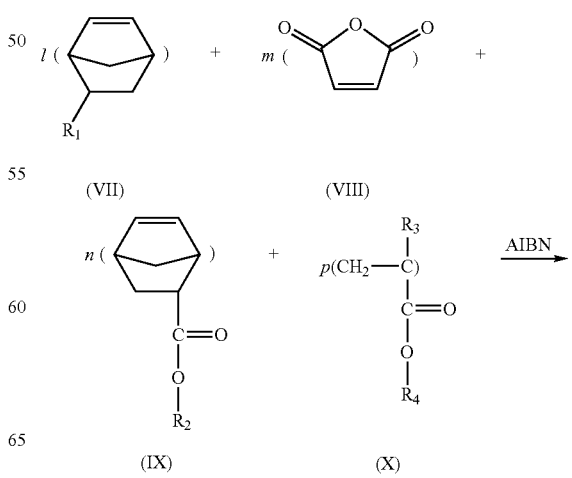

-continued

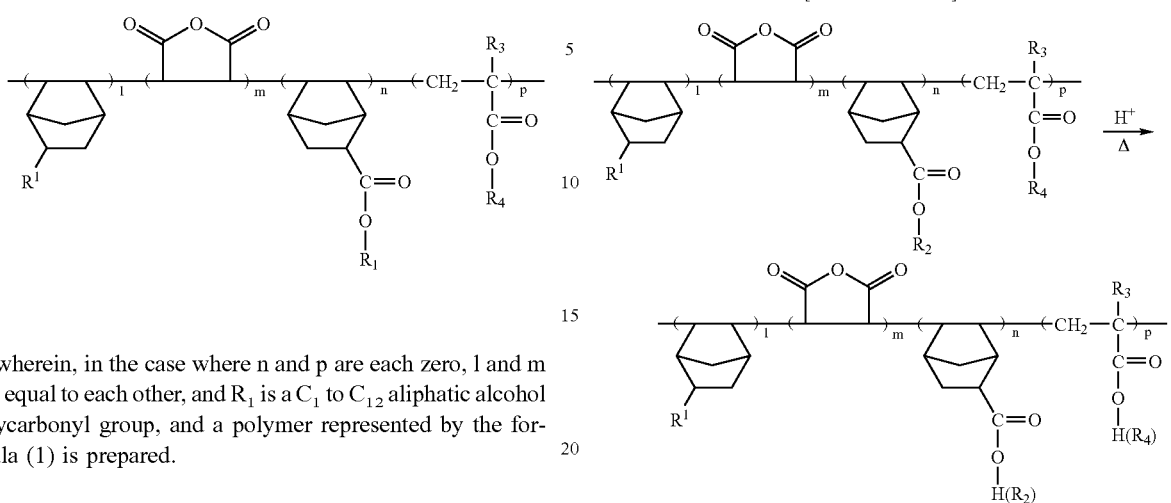

wherein, in the case where n and p are each zero, l and m are equal to each other, and $R_1$ is a $C_1$ to $C_{12}$ aliphatic alcohol oxycarbonyl group, and a polymer represented by the formula (1) is prepared.

Method for Preparing Chemically Amplified Photoresist Composition and Photolithography Process Using the Same The chemically amplified photoresist composition according to the present invention is prepared by dissolving the photosensitive polymer prepared in the above-described manner and a photoacid generator in an appropriate solvent and mixing the same. Here, the photoacid generator is mixed in an amount of 1 to 15% by weight based on the weight of the polymer. Also, it is preferable to complete the photoresist composition by further dissolving 0.01 to 2.0% by weight of an organic base based on the weight of the polymer.

The chemically amplified photoresist composition prepared in the above-described manner can be used for a general photolithography process, and is particularly suitable for forming a fine pattern to satisfy a design rule of 0.20 μm or smaller when using an ArF excimer laser as an exposure light source.

First, the photoresist composition is coated on a substrate where a patterning object material layer is formed to form a photoresist layer having a predetermined thickness, preferably 0.2 to 2 μm. Since the photoresist composition according to the present invention comprise a hydroxy group, it can be easily coated on the substrate. Subsequently, pre-baking is carried out on the photoresist layer. The pre-baking step is performed at a temperature of 70 to 160° C. for 30 to 360 seconds. After the pre-baking step, the photoresist layer is exposed using a mask having a predetermined pattern, using an exposure light source having a wavelength of 248 nm or less, preferably an ArF excimer laser having a wavelength of 193 nm. Acid is generated from the photoacid generator contained in the photoresist layer by exposure. The photosensitive polymer is acidolyzed by the catalytic action of the thus-generated acid to form a lot of carboxy groups, as expressed in reaction scheme 4. As a result, a large amount of hydrophilic groups, e.g., carboxy groups, are produced in the exposed region of the photoresist layer. Thus, a noticeable difference in the polarity of the photoresist layer is created between an exposed region and an unexposed region. That is to say, contrast is noticeably increased.

The parentheses represent that $R_2$ and $R_4$ are not acidolyzed, but are retained after exposure in the case where they are $C_6$ to $C_{20}$ alicyclic hydrocarbons.

After exposure, the photoresist layer is thermally treated for a short time before development, which is referred to as a post-exposure-thermal treatment. The post-exposure-thermal treatment is performed for the purpose of activating acidolysis by the acidic catalyst, that is, for the purpose of increasing contrast by further activating acidolysis of exposed regions by the acidic catalyst to acidolyze ester contained in the photosensitive polymer into carboxy groups.

Next, development is performed using an appropriate developing solution to complete a photoresist pattern. Here, the developing solution used is a developing solution for general development processes, for example, 2.38% by weight of tetramethylammonium hydroxide (TMAH). In the case where a $C_6$ to $C_{20}$ alicyclic hydrocarbon is bonded to the backbone of the photosensitive polymer constituting the photoresist layer, since the photoresist layer in the unexposed region is not easily dissolved in the developing solution, the thickness of the photoresist layer in the unexposed region is not reduced, unlike the conventional art.

After forming the photoresist pattern, a patterning object layer is etched to form a desired pattern. The photoresist pattern of the present invention is formed of a photoresist layer including a photosensitive polymer having a cyclic backbone and a tertiary alicyclic hydrocarbon bonded as a substituent, and thus the etching resistance thereof is large. Therefore, a pattern having a good profile, that is, having a precise critical dimension, can be formed.

The present invention will now be described in more detail with reference to the following examples. However, the invention should not be construed as limited to these examples.

Synthesis of Monomer

EXAMPLE 1

Synthesis of 2-hydroxypropyl-5-norbornene ester 100 mL of THF is put in a round-bottom flask and then cooled to −24° C. using an ice-salt bath, and 66.10 g (1 mmol) of cyclopentadiene derived from dicyclopentadiene by simple distillation was added thereto. Next, 130.14 g (1 mol) of 2 hydroxypropyl acrylate was slowly dropped to be reacted at –24° C. for about 4 hours. Then, the temperature of the reactant was slowly raised to room temperature to then be reacted for about 24 hours and then a reactant product was separated using vacuum distillation (yield: 85%).

EXAMPLE 2

Synthesis of t-butyl 5-norbornene ester

The reactant product was obtained in the same manner as in Example 1, except that 128.17 g (1 mol) of t-butyl acrylate was used, instead of 2-hydroxypropyl acrylate (yield: 87%).

EXAMPLE 3

Synthesis of 2-methyladamantyl acrylate 200 mL of diethyl ether was put into a round-neck flask, 41.5 g of 2-methyl-2-adamantanol and 27.6 g of tetraethyl amine were added thereto and then 22.6 g of acryloyl chloride was dropped. The reactant was reacted at room temperature for about 12 hours and then filtered using diethyl ether. Subsequently, the solvent was removed by an evaporator and then the reactant product was obtained using vacuum distillation (yield: 55%).

Synthesis of Polymer

EXAMPLE 4

Synthesis of poly(2-hydroxypropyl-5-norbornene ester-maleic anhydride)

5.89 g of 2-hydroxypropyl-5-norbornene ester prepared in Example 1 and 2.94 g of maleic anhydride were completely dissolved in 4.27 g of anhydrous ethyl acetate. 0.15 g of AIBN Was added to the resultant, purged using nitrogen gas for about 2 hours and polymerized at a temperature of about 65° C. for about 24 hours.

After the polymerization was complete, the reactant material was precipitated in an excess mixed solution (about 10 times) of n-hexane and diethyl ether in a ratio of 2:1 and the precipitate was dissolved again in THF. Then, the resultant was reprecipitated again in a mixed solution of n-hexane and diethyl ether in a ratio of 2:1. The precipitate was filtered using a glass filter and then dried in a vacuum oven maintained at about 50° C. for about 24 hours to separate 6.3 g of a polymer. The weight average molecular weight and polydispersity of the obtained reactant product were 15,500 and 2.1, respectively.

EXAMPLE 5

Synthesis of poly(2-hydroxypropyl-5-norbornene ester-maleic anhydride-t-butyl methacrylate)

5.89 g of 2-hydroxypropyl-5-norbornene ester prepared in Example 1, 2.94 g of maleic anhydride and 4.27 g of t-butyl methacrylate were completely dissolved in 50 g of anhydrous ethyl acetate. 0.15 g of AIBN was added to the resultant, purged using nitrogen gas for about 2 hours and polymerized at a temperature of about 65' C for about 24 hours.

Separation was carried out in the same manner as in Example 4 to separate 6.3 g of a polymer. The weight average molecular weight and polydispersity of the obtained polymer were 16,500 and 2.1, respectively.

EXAMPLE 6

Synthesis of poly(5-norbornene-2-ol-maleic anhydride-t-butyl methacrylate)

Polymerization and separation were carried out in the same manner as in Example 5 to separate a polymer, except that 50 mmol of 5-norbornene-2-ol was used, instead of 2-hydroxypropyl-5-norbornene ester (yield: 55%). The weight average molecular weight and polydispersity of the obtained polymer were 14,600 and 2.1, respectively.

EXAMPLE 7

Synthesis of poly(2-hydroxypropyl-5-norbornene ester-maleic anhydride-2-methyladamantyl acrylate)

With the exception that 6.6 g of 2-methyladamantyl acrylate prepared in Example 3 was used, instead of t-butyl methacrylate, the same procedure was carried out in the same manner as in Example 5 to separate 10.2 g of a polymer. The weight average molecular weight and polydispersity of the obtained reactant product were 17,100 and 1.9, respectively.

EXAMPLE 8

Synthesis of poly(2-hydroxypropyl-5-norbornene ester-maleic anhydride-t-butyl-5-norbornene ester)

1.96 g of 2-hydroxypropyl-5-norbornene ester prepared in Example 1, 6.86 g of maleic anhydride and 11.66 g of t-butyl norbornene ester were completely dissolved in 10 g of anhydrous ethyl acetate. 0.23 g of AIBN was added to the resultant, purged using nitrogen gas for about 2 hours and polymerized at a temperature of about 65° C. for about 24 hours.

Thereafter, separation was carried out in the same manner as in Example 4 to separate 9.1 g of a polymer. The weight average molecular weight and polydispersity of the obtained polymer were 12,600 and 1.9, respectively.

EXAMPLE 9

Synthesis of poly(2-hydroxypropyl-5-norbornene ester-maleic anhydride-t-butyl 5-norbornene ester-t-butyl acrylate)

With the exception that 1.0 g of t-butyl acrylate was further used in addition to three monomers of Example 8, and 11 g of anhydrous ethyl acetate and 0.24 g of AIBN were used, the same procedure was carried out in the same manner as in Example 8 to separate 11.2 g of a polymer. The weight average molecular weight and polydispersity of the obtained reactant product were 17,100 and 1.9, respectively.

EXAMPLE 10

Synthesis of poly(2-hydroxypropyl-5-norbornene ester-maleic anhydride-t-butyl 5-norbornene ester-isobornyl acrylate)

3.96 g of 2-hydroxypropyl-5-norbornene ester, 13.73 g of maleic anhydride, 23.31 g of t-butyl 5-norbornene ester and 2.92 g of isobornyl acrylate were completely dissolved in 22 g of anhydrous ethyl acetate. 0.48 g of AIBN was added to the resultant, purged using nitrogen gas for about 2 hours and polymerized at a temperature of about 65° C. for about 24 hours.

Thereafter, separation was carried out in the same manner as in Example 4 to separate 19.8 g of a polymer. The weight average molecular weight and polydispersity of the obtained reactant product were 15,700 and 1.8, respectively.

EXAMPLE 11

Synthesis of poly(2-hydroxypropyl-5-norbornene ester-maleic anhydride-t-butyl 5-norbornene ester-2-methyladamantyl acrylate)

1.96 g of 2-hydroxypropyl-5-norbornene ester, 6.86 g of maleic anhydride, 11.66 g of t-butyl 5-norbornene ester and 1.54 g of 2-methyladamantyl acrylate were completely dissolved in 21 g of anhydrous ethyl acetate. 0.24 g of AIBN was added to the resultant, purged using nitrogen gas for about 2 hours and polymerized at a temperature of about 65° C. for about 24 hours.

Thereafter, separation was carried out in the same manner as in Example 4 to separate 29.3 g of a polymer. The weight average molecular weight and polydispersity of the obtained reactant product were 14,500 and 2.0, respectively.

EXAMPLE 12

Synthesis of poly(2-hydroxypropyl-5-norbornene ester-maleic anhydride-t-butyl 5-norbornene ester-isobornyl-5-norbornene ester)

1.96 g of 2-hydroxypropyl-5-norbornene ester, 6.86 g of maleic anhydride, 11.66 g of t-butyl 5-norbornene ester and 1.15 g of isobornyl-5-norbornene ester were completely dissolved in 11 g of anhydrous ethyl acetate. 0.24 g of AIBN was added to the resultant, purged using nitrogen gas for about 2 hours and polymerized at a temperature of about 65° C. for about 24 hours.

Thereafter, separation was carried out in the same manner as in Example 4 to separate 7.59 g of a polymer. The weight average molecular weight and polydispersity of the obtained reactant product were 11,200 and 1.9, respectively.

EXAMPLE 13

Synthesis of poly(5-norbornene-2-ol-maleic anhydride-t-butyl 5-norbornene ester-isobornyl acrylate)

With the exception that 5-norbornene-2-ol was used, instead of 2-hydroxypropyl-5-norbornene ester, the same procedure was carried out in the same manner as in Example 10 to separate a polymer (yield: 40%). The weight average molecular weight and polydispersity of the obtained reactant product were 14,200 and 1.9, respectively.

EXAMPLE 14

Synthesis of poly(5-norbornene-2-methanol-maleic anhydride-t-butyl 5-norbornene ester-isobornyl acrylate)

With the exception that 5-norbornene-2-methanol was used, instead of 2-hydroxypropyl-5-norbornene ester, the same procedure was carried out in the same manner as in Example 10 to separate a polymer (yield: 40%). The weight average molecular weight and polydispersity of the obtained reactant product were 13,200 and 1.8, respectively.

EXAMPLE 15

Synthesis of poly(norbornene ester-maleic anhydride-t-butyl 5-norbornene ester-2-hydroxyethyl acrylate)

Except that norbornene, instead of 2-hydroxypropyl-5-norbornene ester, was used, and 2-hydroxyethyl acrylate, instead of isobornyl acrylate, was used, the same procedure was carried out in the same manner as in Example 10 to separate a polymer (yield: 45%). The weight average molecular weight and polydispersity of the obtained reactant product were 12,700 and 2.1, respectively.

Method for Preparing Photoresist Composition and Photolithography Process Using the Same

EXAMPLE 16

1.0 g of a terpolymer prepared in Example 5 by polymerizing 2-hydroxypropyl-5-norbornene ester, maleic anhydride and t-butyl methacrylate in a ratio of 1:1:1, 0.02 g of triphenylsulfonium triflate as a photoacid generator and 2 mg of triisobutylamine as an organic base were dissolved in 8.0 g of propylene glycol monomethyl ether acetate (PGMEA). Subsequently, the mixture was filtered using a 0.2 µm filter, resulting in a photoresist composition.

An anti-reflection layer was coated on a wafer where a patterning object material layer and then the acquired photoresist composition was spin coated to a thickness of about 0.4 µm. The photoresist composition coated wafer was pre-baked at a temperature of about 140° C. for about 90 seconds, exposed using a mask defining a predetermined pattern and an ArF excimer laser (NA: 0.6) as an exposure light source, and post-baked at a temperature of about 110° C. for about 90 seconds. Thereafter, the resultant was developed using 2.38% by weight of TMAH for about 60 seconds, thereby forming a photoresist pattern.

As a result, a 0.20 µm line and space photoresist pattern was obtained at an exposure dose of about 10 mJ/cm$^2$.

EXAMPLE 17

A photoresist composition was prepared using 1.0 g of a terpolymer prepared in Example 7 by polymerizing 2-hydroxypropyl-5-norbornene ester, maleic anhydride and 2-methyladamantyl acrylate in a ratio of 1:1:1, and then a photolithography process was performed in the same manner as in Example 16.

As a result, a 0.22 µm line and space photoresist pattern was obtained at an exposure dose of about 11 mJ/cm$^2$.

EXAMPLE 18

A photoresist composition was prepared using 1.0 g of terpolymer prepared in Example 8 by polymerizing 2-hydroxypropyl-5-norbornene ester, maleic anhydride and t-butyl 5-norbornene ester in a ratio of 1:7:6, and then a photolithography process was performed in the same manner as in Example 16.

As a result, a 0.20 µm line and space photoresist pattern was obtained at an exposure dose of about 11 mJ/cm$^2$.

EXAMPLE 19

A photoresist composition was prepared using 1.0 g of a tetrapolymer prepared in Example 9 by polymerizing 2-hydroxypropyl-5-norbornene ester, maleic anhydride, t-butyl 5-norbornene ester and t-butyl acrylate in a ratio of 1:7:6:1.4, and then a photolithography process was performed in the same manner as in Example 16.

As a result, a 0.24 µm line and space photoresist pattern was obtained at an exposure dose of about 12 mJ/cm$^2$.

EXAMPLE 20

A photoresist composition was prepared using 1.0 g of a tetrapolymer prepared in Example 10 by polymerizing 2-hydroxypropyl-5-norbornene ester, maleic anhydride, t-butyl 5-norbornene ester and isobornyl acrylate in a ratio of 1:7:6:0.7, and then a photolithography process was performed in the same manner as in Example 16.

As a result, a 0.18 µm line and space photoresist pattern was obtained at an exposure dose of about 11 mJ/cm$^2$.

EXAMPLE 21

A photoresist composition was prepared using 1.0 g of a tetrapolymer prepared in Example 11 by polymerizing 2-hydroxypropyl-5-norbornene ester, maleic anhydride, t-butyl 5-norbornene ester and 2-methyladamantyl acrylate in a ratio of 1:7:6:0.7, and then a photolithography process was performed in the same manner as in Example 16.

As a result, a 0.20 µm line and space photoresist pattern was obtained at an exposure dose of about 10 mJ/cm$^2$.

EXAMPLE 22

A photoresist composition was prepared using 1.0 g of a tetrapolymer prepared in Example 12 by polymerizing 2-hydroxypropyl-5-norbornene ester, maleic anhydride, t-butyl 5-norbornene ester and isobornyl-5-norbornene ester in a ratio of 1:7:6:0.7, and then a photolithography process was performed in the same manner as in Example 16.

As a result, a 0.24 µm line and space photoresist pattern was obtained at an exposure dose of about 10 mJ/cm$^2$.

EXAMPLE 23

A photoresist composition was prepared using 1.0 g of a tetrapolymer prepared as a photosensitive polymer in Example 13 by polymerizing 5-norbornene-2-ol, maleic anhydride, t-butyl 5-norbornene ester and isobornyl acrylate in a ratio of 1:5:4:0.5 and 0.02 g of triphenylsulfonium nonaflate, and then a photolithography process was performed in the same manner as in Example 16.

As a result, a 0.22 µm line and space photoresist pattern was obtained at an exposure dose of about 13 mJ/cm$^2$.

EXAMPLE 24

A photoresist composition was prepared using 1.0 g of a tetrapolymer prepared as a photosensitive polymer in Example 14 by polymerizing 5-norbornene-2-methanol, maleic anhydride, t-butyl 5-norbornene ester and isobornyl acrylate in a ratio of 1:5:4:0.5, 0.02 g of triphenylsulfonium nonaflate and 2 mg of triethanolamine as an organic base, and then a photolithography process was performed in the same manner as in Example 16.

As a result, a 0.20 µm line and space photoresist pattern was obtained at an exposure dose of about 14 mJ/cm$^2$.

EXAMPLE 25

A photoresist composition was prepared using 1.0 g of a tetrapolymer prepared in Example 15 by polymerizing norbornene, maleic anhydride, t-butyl 5-norbornene ester and 2-hydroxy ethyl acrylate in a ratio of 1:5:4:0.5, 0.01 g of a mixture of 0.01 g of succinimidyl triflate and 0.01 g of triphenylsulfonium triflate as a photoacid generator, and 2 mg of triisobutylamine as an organic base, and then a photolithography process was performed in the same manner as in Example 16.

As a result, a 0.22 µm line and space photoresist pattern was obtained at an exposure dose of about 13 mJ/cm$^2$.

According to the present invention, since the backbone of a photosensitive polymer is a cyclic structure, the etching resistance thereof is large. Also, since an alcohol group is bonded to the backbone of the polymer, adhesion to underlying layer materials is excellent. Further, since wettability to a developing solution is large, development can be carried out using a conventional developing solution, for example, 2.38 wt % of TMAH. In particular, in the case where a secondary alcohol group is bonded to the backbone, the stability of the polymer is also increased.

Thus, if a photoresist composition is formed using the photosensitive polymer according to the present invention, the etching resistance of the photoresist composition is increased and adhesion to an underlying film becomes excellent. Also, development can be performed using a conventional developing solution of a widely adopted concentration, for example, 2.38 wt % of TMAH. Further, in the case where a $C_6$ to $C_{20}$ alicyclic hydrocarbon is bonded to the polymer, the photoresist layer in an unexposed region is not easily dissolved in a developing solution. Thus, the thickness of the photoresist layer in the unexposed region is not reduced. If acid-labile bulky groups are bonded to the polymer, there is a substantial difference in polarity of the photoresist composition between exposed regions and unexposed regions, and the contrast is further increased.

What is claimed is:

1. A photosensitive polymer comprising:
    a first monomer selected from the group consisting of norbornene having $C_1$ to $C_{12}$ aliphatic alcohol as a substituent, norbornene carboxylic acid, norbornene having a $C_1$ to $C_{12}$ aliphatic hydrocarbon group with carboxylic anhydride group pendent thereto as a substituent;
    a second monomer which is maleic anhydride; and
    a third monomer selected from the group consisting of norbornene ester having a $C_6$ to $C_{20}$ aliphatic hydrocarbon group as a substituent and (meth)acrylate having a $C_6$ to $C_{20}$ aliphatic hydrocarbon group as a substituent; and
    wherein the weight average molecular weight of the polymer is in the range of 3,000 to 100,000.

2. The photosensitive polymer according to claim 1, wherein the third monomer includes adamantly(meth)acrylate, norbornyl(meth)acrylate, isobornyl(meth)acrylate and naphtyl(meth)acrylate.

3. A photosensitive polymer comprising:
    a first monomer selected from the group consisting of norbornene having $C_1$ to $C_{12}$ aliphatic alcohol as a substituent, norbornene carboxylic acid, norbornene having a $C_1$ to $C_{12}$ aliphatic hydrocarbon group with a carboxy group pendent thereto as a substituent, norbornene having a $C_1$ to $C_{12}$ aliphatic hydrocarbon group with a carboxylic anhydride group pendent thereto as a substituent, and norbornene ester having $C_1$ to $C_{12}$ aliphatic alcohol with a carboxylic anhydride group pendent thereto as a substituent;

a second monomer which is maleic anhydride;

a third monomer which is norbornene ester having an acid-labile group as a substituent; and a fourth monomer which is norbornene ester having a $C_6$ to $C_{20}$ alicyclic hydrocarbon group as a substituent; and wherein the weight average molecular weight of the polymer is in the range of 3,000 to 100,000.

4. The photosensitive polymer according to claim 3, wherein the first monomer includes 2° propanol norbornene ester, wherein the third monomer includes t-butyl norbornene ester, and wherein the fourth monomer includes adamantly norbornene ester, norbornyl norbornene ester, isobornyl norbornene ester or naphtyl norbornene ester.

* * * * *